(12) United States Patent
Pan et al.

(10) Patent No.: US 11,424,174 B2
(45) Date of Patent: Aug. 23, 2022

(54) SEMICONDUCTOR DEVICE AND METHOD OF FORMING THE SAME

(71) Applicant: Taiwan Semiconductor Manufacturing Co., Ltd., Hsinchu (TW)

(72) Inventors: Chih-Chien Pan, Taipei (TW); Chin-Fu Kao, Taipei (TW); Li-Hui Cheng, New Taipei (TW); Szu-Wei Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 134 days.

(21) Appl. No.: 17/063,143

(22) Filed: Oct. 5, 2020

(65) Prior Publication Data

US 2021/0020534 A1    Jan. 21, 2021

Related U.S. Application Data

(62) Division of application No. 16/176,725, filed on Oct. 31, 2018, now Pat. No. 10,796,976.

(51) Int. Cl.

| H01L 23/31 | (2006.01) |
| H01L 25/065 | (2006.01) |
| H01L 23/498 | (2006.01) |
| H01L 21/48 | (2006.01) |
| H01L 21/56 | (2006.01) |

(Continued)

(52) U.S. Cl.
CPC ...... *H01L 23/3157* (2013.01); *H01L 21/4853* (2013.01); *H01L 21/4857* (2013.01); *H01L 21/561* (2013.01); *H01L 21/565* (2013.01); *H01L 21/568* (2013.01); *H01L 21/76898* (2013.01); *H01L 23/3114* (2013.01); *H01L 23/49816* (2013.01); *H01L 23/49827* (2013.01); *H01L 24/11* (2013.01); *H01L 24/81* (2013.01); *H01L 24/96* (2013.01); *H01L 24/97* (2013.01); *H01L 25/0657* (2013.01)

(58) Field of Classification Search
CPC ............ H01L 23/3157; H01L 23/3114; H01L 23/49816; H01L 23/49827; H01L 21/4853; H01L 21/561; H01L 21/565; H01L 24/11; H01L 24/81

See application file for complete search history.

(56) References Cited

U.S. PATENT DOCUMENTS

| 8,395,191 B2 * | 3/2013 | Or-Bach ............... H01L 29/732 438/455 |
| 8,993,380 B2 | 3/2015 | Hou et al. |

(Continued)

FOREIGN PATENT DOCUMENTS

| CN | 104134651 A | 11/2014 |
| JP | 2006140327 A | 6/2006 |

(Continued)

*Primary Examiner* — Nathan W Ha
(74) *Attorney, Agent, or Firm* — Slater Matsil, LLP

(57) ABSTRACT

A method of forming a semiconductor device includes attaching a first semiconductor device to a first surface of a substrate; forming a sacrificial structure on the first surface of the substrate around the first semiconductor device, the sacrificial structure encircling a first region of the first surface of the substrate; and forming an underfill material in the first region.

20 Claims, 12 Drawing Sheets

(51) Int. Cl.
*H01L 21/768* (2006.01)
*H01L 23/00* (2006.01)

(56) References Cited

U.S. PATENT DOCUMENTS

| | | | |
|---|---|---|---|
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,460,938 B2 | 10/2016 | Miyamoto | |
| 9,461,018 B1 | 10/2016 | Tsai et al. | |
| 9,496,189 B2 | 11/2016 | Yu et al. | |
| 9,640,531 B1* | 5/2017 | Or-Bach | H01L 27/1203 |
| 9,666,502 B2 | 5/2017 | Chen et al. | |
| 9,735,131 B2 | 8/2017 | Su et al. | |
| 9,871,034 B1* | 1/2018 | Or-Bach | H01L 27/088 |
| 9,953,931 B1 | 4/2018 | Yao et al. | |
| 9,972,558 B1* | 5/2018 | Talledo | H01L 21/4825 |
| 2010/0078791 A1 | 4/2010 | Yim et al. | |
| 2010/0187672 A1 | 7/2010 | Yamamoto | |
| 2011/0147912 A1 | 6/2011 | Karpur et al. | |
| 2012/0127689 A1 | 5/2012 | McLellan et al. | |
| 2014/0001644 A1 | 1/2014 | Yu et al. | |
| 2014/0054773 A1 | 2/2014 | Kurashima et al. | |
| 2014/0091472 A1* | 4/2014 | Honma | H01L 24/19 |
| | | | 257/773 |
| 2015/0162307 A1 | 6/2015 | Chen et al. | |
| 2015/0303163 A1 | 10/2015 | Chuang et al. | |
| 2016/0093591 A1* | 3/2016 | Lan | H01L 21/76877 |
| | | | 438/107 |
| 2016/0190108 A1 | 6/2016 | Lee et al. | |
| 2016/0234941 A1 | 8/2016 | Choi et al. | |
| 2016/0276307 A1 | 9/2016 | Lin | |
| 2016/0293554 A1 | 10/2016 | Tan et al. | |
| 2016/0293555 A1 | 10/2016 | Oka et al. | |
| 2016/0329261 A1* | 11/2016 | Hung | H01L 23/3675 |
| 2017/0077022 A1 | 3/2017 | Scanlan et al. | |
| 2017/0117291 A1* | 4/2017 | Or-Bach | H01L 29/47 |
| 2017/0154854 A1 | 6/2017 | Xiao | |
| 2017/0207178 A1* | 7/2017 | Tadakuma | H01L 23/552 |
| 2017/0256479 A1 | 9/2017 | Liu et al. | |
| 2017/0287735 A1* | 10/2017 | Yao | H01L 21/565 |
| 2018/0060475 A1* | 3/2018 | Sinha | G06F 30/34 |
| 2018/0151461 A1 | 5/2018 | Cho | |
| 2018/0166420 A1* | 6/2018 | Park | H01L 23/46 |

FOREIGN PATENT DOCUMENTS

| | | |
|---|---|---|
| JP | 2007142255 A | 6/2007 |
| JP | 2010283036 A | 12/2010 |

* cited by examiner

SEMICONDUCTOR DEVICE AND METHOD OF FORMING THE SAME

PRIORITY CLAIM AND CROSS-REFERENCE

This application is a divisional of U.S. patent application Ser. No. 16/176,725, filed on Oct. 31, 2018, and entitled "Semiconductor Device and Method of Forming the Same," which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. Another example is a Chip-On-Wafer-On-Substrate (CoWoS) structure, where a semiconductor chip is attached to a wafer (e.g., an interposer) to form a Chip-On-Wafer (CoW) structure. The CoW structure is then attached to a substrate (e.g., a printed circuit board) to form a CoWoS structure. These and other advanced packaging technologies enable production of semiconductor devices with enhanced functionalities and small footprints.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
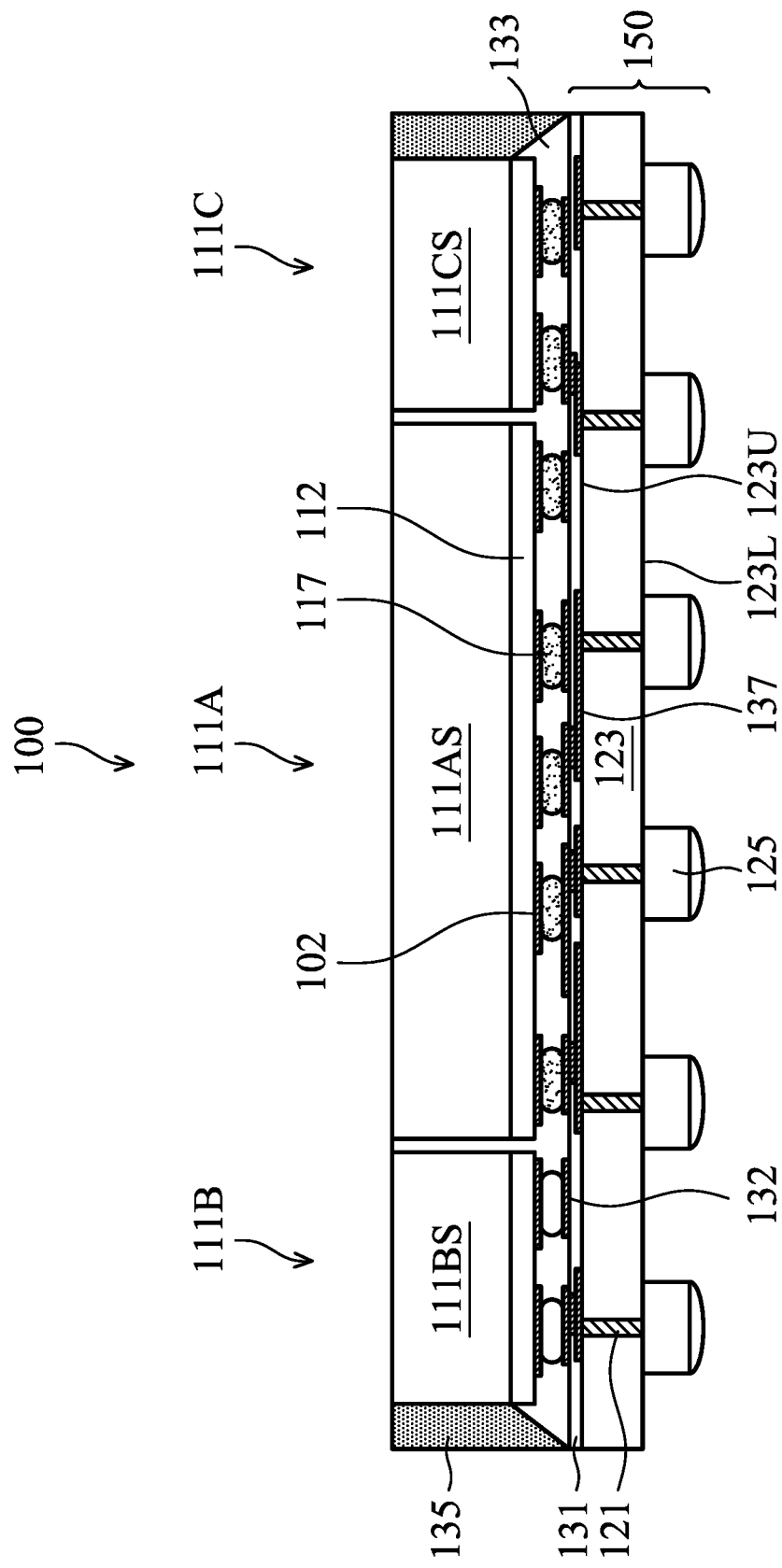
FIG. 1A illustrates a cross-sectional view of a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. Throughout the description, unless otherwise specified, like reference numerals in difference figures refer to the same or similar component formed by a same or similar method using a same or similar material(s).

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A illustrates a cross-sectional view of a semiconductor device 100, in accordance with some embodiments. The semiconductor device 100 has a Chip-on-Wafer (CoW) structure. As illustrated in FIG. 1A, the semiconductor device 100 includes a wafer 150 (e.g., an interposer), one or more dies 111 (e.g., 111A, 111B, and 111C) attached to the wafer 150, an underfill material 133 between the dies 111 and the wafer 150, and a molding material 135 over the wafer 150 and around the dies 111. The semiconductor device 100 is subsequently attached to a substrate to form a semiconductor device 200 having a Chip-On-Wafer-On-Substrate (CoWoS) structure, details of which are described hereinafter.

To form the semiconductor device 100, one or more dies 111 (may also be referred to as semiconductor dies, chips, or integrated circuit (IC) dies) are attached to an upper surface of the wafer 150. In the illustrated embodiment, the wafer 150 is an interposer, and therefore, the wafer 150 may also be referred to as an interposer in the discussion herein, with the understanding that other types of suitable wafers may also be used as the wafer 150. The dies 111 (e.g., 111A, 111B, and 111C) are a same type of dies (e.g., memory dies, or logic dies), in some embodiments. In other embodiments, the dies 111 are of different types, e.g., the die 111A may be a logic die and the dies 111B and 111C may be memory dies. The number of dies 111 and the relative locations of the dies 111 in FIG. 1A are merely examples, other numbers and other locations of the dies are possible and are fully intended to be included within the scope of the present disclosure.

In some embodiments, the die 111A includes a substrate 111AS, electrical components (e.g., transistors, resistors, capacitors, diodes, or the like) formed in/on the substrate 111AS, and an interconnect structure 112 over the substrate 111AS connecting the electrical components to form functional circuits of the die 111A. The die 111A also includes conductive pads 102 and conductive pillars 117 (also referred to as die connectors) formed on the conductive pads 102. The conductive pillars 117 provide electrical connection to the circuits of the die 111A.

The substrate 111AS of the die 111A may be a semiconductor substrate, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The electrical components of the die 111A comprise a wide variety of active components (e.g., transistors) and passive components (e.g., capacitors, resistors, inductors), and the like. The electrical components of the die 111A may be formed using any suitable methods either within or on the substrate 111AS of the die 111A. The interconnect structure 112 of the die 111A comprises one or more metallization layers (e.g., copper layers) formed in one or more dielectric layers, and is used to connect the various electrical components to form functional circuitry. In an embodiment the interconnect structure is formed of alternating layers of dielectric and conductive material (e.g., copper) and may be formed through any suitable process (such as deposition, damascene, dual damascene, etc.).

One or more passivation layers (not shown) may be formed over the interconnect structure 112 of the die 111A in order to provide a degree of protection for the underlying structures of the die 111A. The passivation layer may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer may be formed through a process such as chemical vapor deposition (CVD), although any suitable process may be utilized.

Conductive pads 102 may be formed over the passivation layer and may extend through the passivation layer to be in electrical contact with the interconnect structure 112 of the die 111A. The conductive pads 102 may comprise aluminum, but other materials, such as copper, may alternatively be used.

Conductive pillars 117 of the die 111A are formed on the conductive pads 102 to provide conductive regions for electrical connection to the circuits of the die 111A. The conductive pillars 117 may be copper pillars, contact bumps such as microbumps, or the like, and may comprise a material such as copper, tin, silver, combinations thereof, or other suitable material.

The dies 111B and 111C are formed using the same or similar processing steps, although different electrical components and different electrical connections may be formed such that circuits with different functions are formed for the different dies. Details are not repeated here.

Looking at the wafer 150, which includes a substrate 123, through vias 121 (also referred to as through-substrate vias (TSVs)), a redistribution structure 131, conductive pads 132 at an upper surface of the wafer 150, and external connectors 125 (may also be referred to as conductive bumps) at a lower surface of the wafer 150. The structure of the wafer 150 in FIG. 1A is merely a non-limiting example. Other structures are possible and are fully intended to be included within the scope of the present disclosure.

The substrate 123 may be, e.g., a silicon substrate, doped or undoped, or an active layer of a silicon-on-insulator (SOI) substrate. However, the substrate 123 may alternatively be a glass substrate, a ceramic substrate, a polymer substrate, or any other substrate that may provide a suitable protection and/or interconnection functionality.

In some embodiments, the substrate 123 may include electrical components, such as resistors, capacitors, signal distribution circuitry, combinations of these, or the like. These electrical components may be active, passive, or a combination thereof. In other embodiments, the substrate 123 is free from both active and passive electrical components therein. All such combinations are fully intended to be included within the scope of this disclosure.

Through vias 121 are formed in the substrate 123 and extend from an upper surface 123U of the substrate 123 to a lower surface 123L of the substrate 123. The through vias 121 provide electrical connections between the conductive pads 132 and the external connectors 125. The through vias 121 may be formed of a suitable conductive material such as copper, tungsten, aluminum, alloys, doped polysilicon, combinations thereof, and the like. A barrier layer may be formed between the through vias 121 and the substrate 123. The barrier layer may comprise a suitable material such as titanium nitride, although other materials, such as tantalum nitride, titanium, or the like, may alternatively be utilized.

Once the through vias 121 have been formed, the redistribution structure 131 may be formed on the upper surface 123U of the substrate 123 in order to provide interconnectivity between the through vias 121, the external connectors 125, and the dies 111A, 111B and 111C. The redistribution structure 131 comprises electrically conductive features (conducive lines and/or vias) disposed in one or more dielectric layers of the redistribution structure 131. In some embodiments, the one or more dielectric layers are formed of a polymer, such as polybenzoxazole (PBO), polyimide, benzocyclobutene (BCB), or the like. In other embodiments, the dielectric layer is formed of a nitride such as silicon nitride; an oxide such as silicon oxide, phosphosilicate glass (PSG), borosilicate glass (BSG), boron-doped phosphosilicate glass (BPSG), or the like; or the like. The one or more dielectric layers of the redistribution structure 131 may be formed by any acceptable deposition process, such as spin coating, chemical vapor deposition (CVD), laminating, combination thereof, or the like.

In some embodiments, the conductive features of the redistribution structure 131 comprise conductive lines and/ or conductive via formed of a suitable conductive material such as copper, titanium, tungsten, aluminum, or the like. The conductive features may be formed by, e.g., forming openings in a dielectric layer of the redistribution structure to expose underlying conductive features, forming a seed layer over the dielectric layer and in the openings, forming a patterned photoresist with a designed pattern over the seed layer, plating (e.g., electroplating or electroless plating) the conductive material in the designed pattern and over the seed layer, and removing the photoresist and portions of seed layer on which the conductive material is not formed. After the redistribution structure 131 is formed, the conductive pads 132 may be formed over and electrically coupled to the redistribution structure 131 using any suitable material such as copper, aluminum, gold, tungsten, combinations thereof, or the like.

Next, the external connectors 125 are formed on the lower surface 123L of the substrate 123. The external connectors 125 may be any suitable type of external contacts, such as microbumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations thereof, or the like.

As illustrated in FIG. 1A, the conductive pillar 117 of the dies 111 are bonded to the conductive pads 132 of the wafer 150 by, e.g., solder regions. A reflow process may be performed to bond the dies 111 to the wafer 150.

After the dies 111 are bonded to the wafer 150, an underfill material 133 is formed between the dies 111 and the wafer 150. The underfill material 133 may, for example, comprise a liquid epoxy that is dispensed in a gap between the dies 111 and the wafer 150, e.g., using a dispensing needle or other suitable dispensing tool, and then cured to harden. As illustrated in FIG. 1A, the underfill material 133 fills the gap between the dies 111 and the wafer 150, and may also fill gaps between sidewalls of the dies 111.

Next, a molding material 135 is formed over the wafer 150 and around the dies 111. The molding material 135 also surrounds the underfill material 133. The molding material 135 may comprise an epoxy, an organic polymer, a polymer with or without a silica-based filler or glass filler added, or other materials, as examples. In some embodiments, the molding material 135 comprises a liquid molding compound (LMC) that is a gel type liquid when applied. The molding material 135 may also comprise a liquid or solid when applied. Alternatively, the molding material 135 may comprise other insulating and/or encapsulating materials. The molding material 1:35 is applied using a wafer level molding process in some embodiments. The molding material 135 may be molded using, for example, compressive molding, transfer molding, molded underfill (MUF), or other methods.

Next, the molding material 135 is cured using a curing process, in some embodiments. The curing process may comprise heating the molding material 135 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 135 may be cured using other methods. In some embodiments, a curing process is not included.

After the molding material 135 is formed, a planarization process, such as chemical and mechanical planarization (CMP), may be performed to remove excess portions of the molding material 135 from over the dies 111, such that the molding material 135 and the dies 111 have a coplanar upper surface. As illustrated in FIG. 1A, the molding material 135 is conterminous with the substrate 123 of the wafer 150.

Figure 1B:
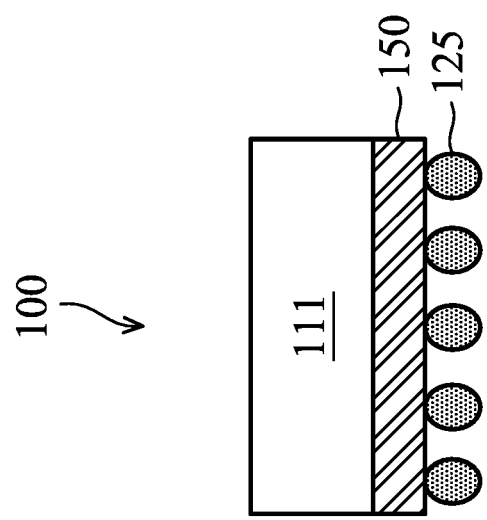
FIG. 1B illustrates a schematic cross-sectional view of the semiconductor device of FIG. 1A, in accordance with some embodiments.

FIG. 1B illustrates a simplified schematic cross-sectional view of the semiconductor device 100 of FIG. 1A. The semiconductor device 100 illustrated in FIG. 1B is used in subsequent figures to represent the semiconductor device 100 of FIG. 1A. For simplicity, not all features of the semiconductor device 100 are illustrated in FIG. 1B.

Figure 2:
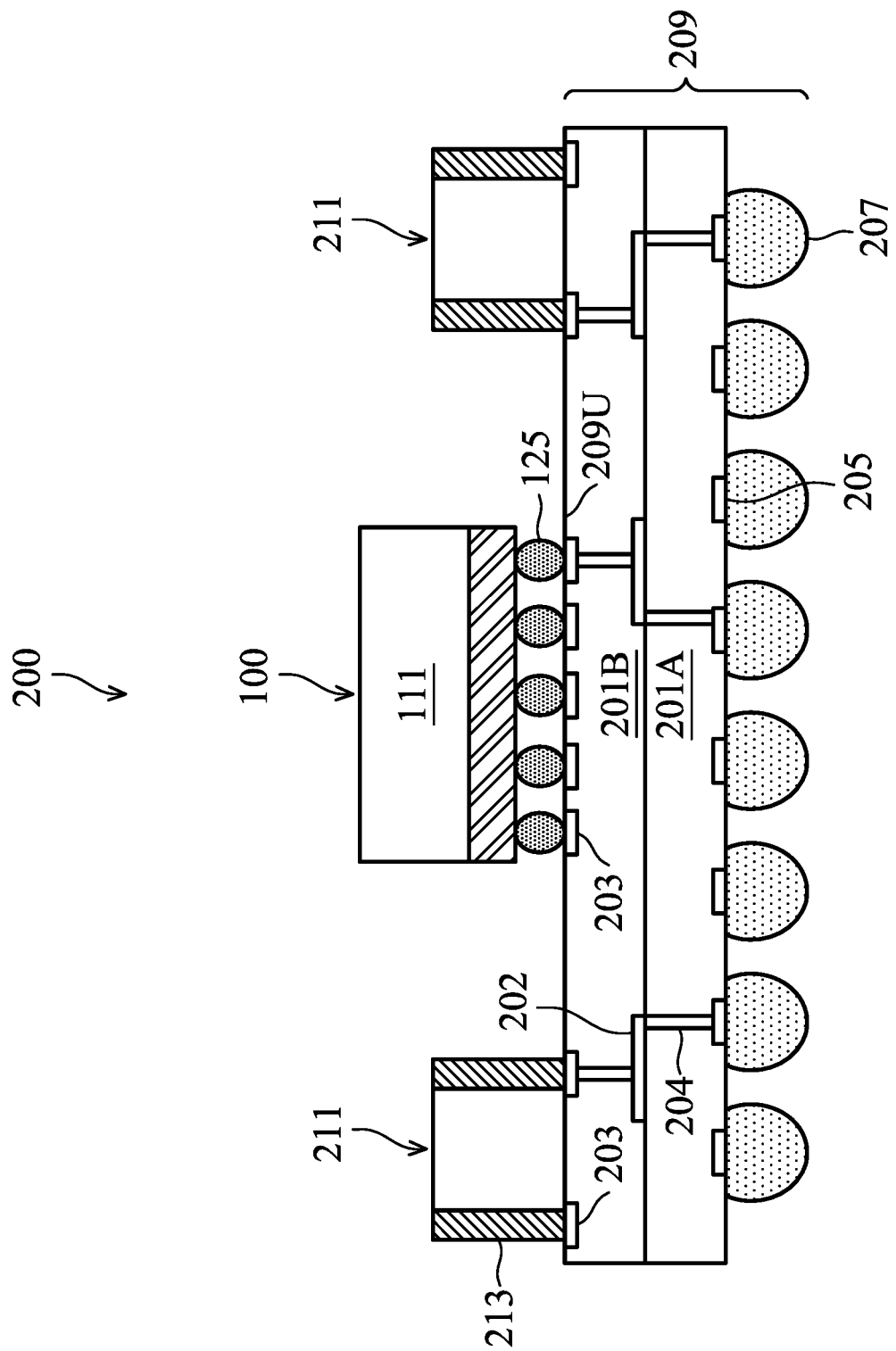
FIGS. 2-6 illustrate various views of a semiconductor device at various stages of fabrication, in accordance with an embodiment.

FIGS. 2-6 illustrate various views (e.g., cross-sectional view, top view) of a semiconductor device 200 at various stages of fabrication, in accordance with an embodiment. As illustrated in FIG. 2, the semiconductor device 100 of FIG. 1A (or FIG. 1B) is bonded to an upper surface of a substrate 209 (e.g., a printed circuit board) to form the semiconductor device 200, which has a Chip-On-Wafer-On-Substrate (CoWoS) structure in some embodiments. FIG. 2 also illustrates passive components 211 attached to the upper surface of the substrate 209, and external connectors 207 formed on a lower surface of the substrate 209.

In some embodiments, the substrate 209 is a multiple-layer circuit board such as a printed circuit board (PCB). For example, the substrate 209 may include one more dielectric layers 201 (e.g., 201A, 201B) formed of bismaleimide triazine (BT) resin, FR-4 (a composite material composed of woven fiberglass cloth with an epoxy resin binder that is flame resistant), ceramic, glass, plastic, tape, film, or other supporting materials. The substrate 209 may include electrically conductive features (e.g., conductive lines 202 and vias 204) formed in/on the substrate 209. As illustrated in FIG. 2, the substrate 209 has conductive pads 203 formed on an upper surface 209U of the substrate 209, and conductive pads 205 formed on a lower surface of the substrate 209 opposing the upper surface 209U, which conductive pads 203 and 205 are electrically coupled to the conductive features of the substrate 209.

The semiconductor device 100 is bonded to the conductive pads 203 of the substrate 209. A reflow process may be performed to electrically and mechanically couple the external connectors 125 of the semiconductor device 100 to the conductive pads 203 of the substrate 209.

FIG. 2 also illustrates passive components 211 attached to the upper surface 209U of the substrate 209 adjacent to the semiconductor device 100. The passive components 211 may be, e.g., surface-mount devices (SMDs) such as surface-mount capacitors, surface-mount inductors, surface-mount resistors, and the like. Contact terminals 213 of the passive components 211 are bonded to the conductive pads 203. The passive components 211 are attached to the substrate 209 before the semiconductor device 100 is attached to the substrate 209, in some embodiments. In other embodiments, the passive components 211 are attached to the substrate 209 after the semiconductor device 100 is attached to the substrate 209.

Still referring to FIG. 2, the external connectors 207, which may be solder balls, copper pillars, or the like, are formed on the conductive pads 205 at the lower surface of the substrate 209. Therefore, the semiconductor device 100, the passive components 211, and the external connectors 207 are electrically interconnected through the conductive features of the substrate 209. For simplicity, details of the substrate 209, such as the conductive features 202/204 and the contact pads 203/205 may not be illustrated in subsequent figures, with the understanding that these features may be formed in/on the substrate 209 as illustrated in FIG. 2.

Figure 3:
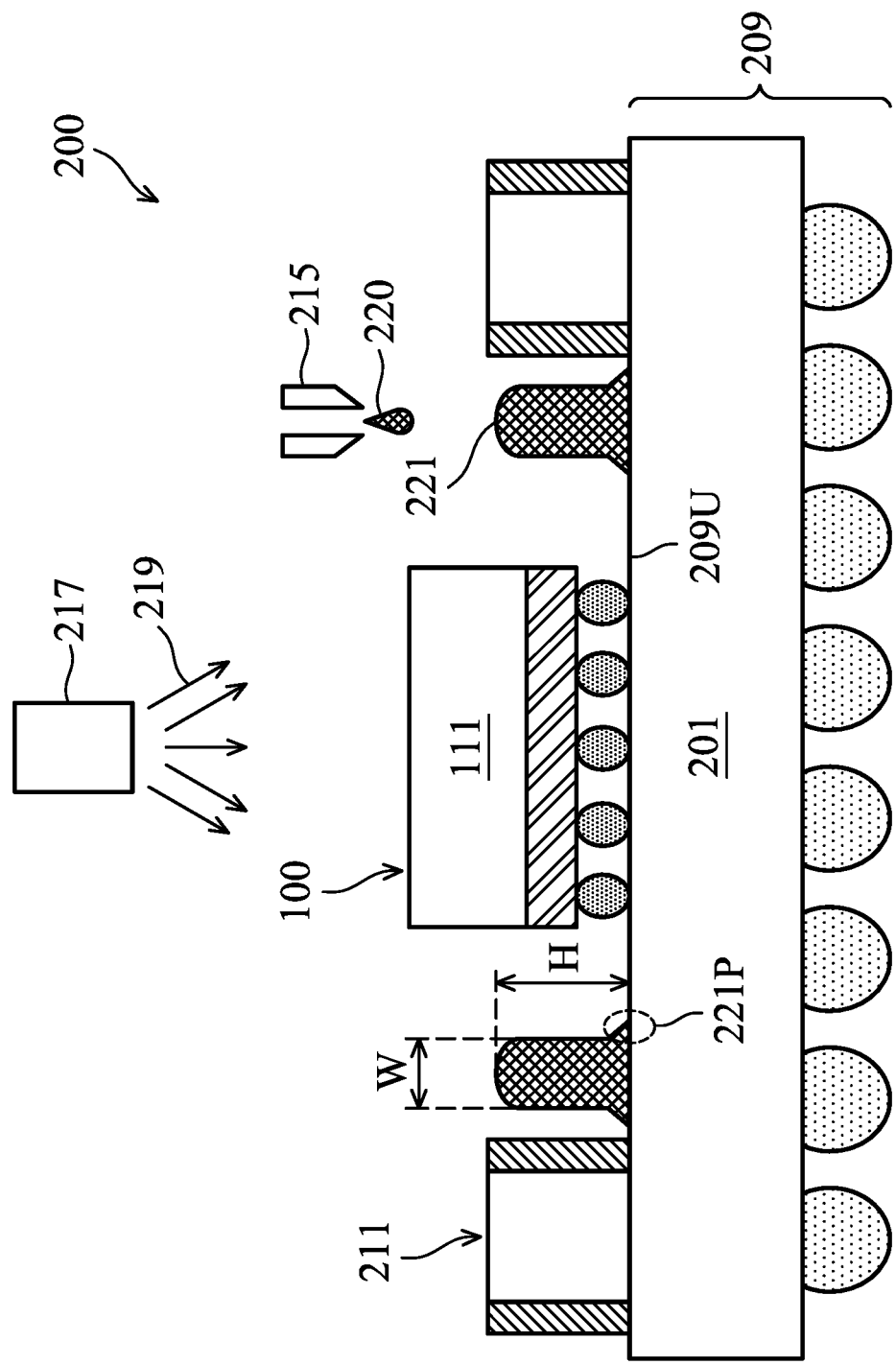

Next, referring to FIG. 3, a dam structure 221 is formed on the upper surface 209U of the substrate 209 around the semiconductor device 100. The dam structure 221 is formed between the semiconductor device 100 and the passive components 211 (see also FIG. 4), and encircles (e.g., surrounds) an area of the upper surface 209U to which the semiconductor device 100 is attached. The dam structure 221 is used in subsequent processing to contain (e.g., limit, confine) an underfill material 225 within the boundaries of the dam structure 221, and therefore, the dam structure 221 may also be referred to an underfill stopper. In subsequent processing, the dam structure 221 is removed after the underfill material 225 is cured. For this reason, the dam structure 221 may also be referred to as a sacrificial structure.

As illustrated in FIG. 3, the dam structure 221 is formed of a suitable material 220 such as polymer, polyimide, epoxy, or the like. The material 220 of the dam structure 221 has an etching selectivity (e.g., having a different etching rate) from other elements of semiconductor device 200, such that in subsequent processing to remove the dam structure, an etching process may be used to remove the dam structure 221 easily without substantially attacking other elements (e.g., the substrate 209, the passive components 211, and the semiconductor device 100) of the semiconductor device 200, in some embodiments. In an exemplary embodiment, the dam structure 221 is formed of an acrylic polymer, which may be easily removed by a wet etch process using potassium hydroxide (KOH).

Figure 4:
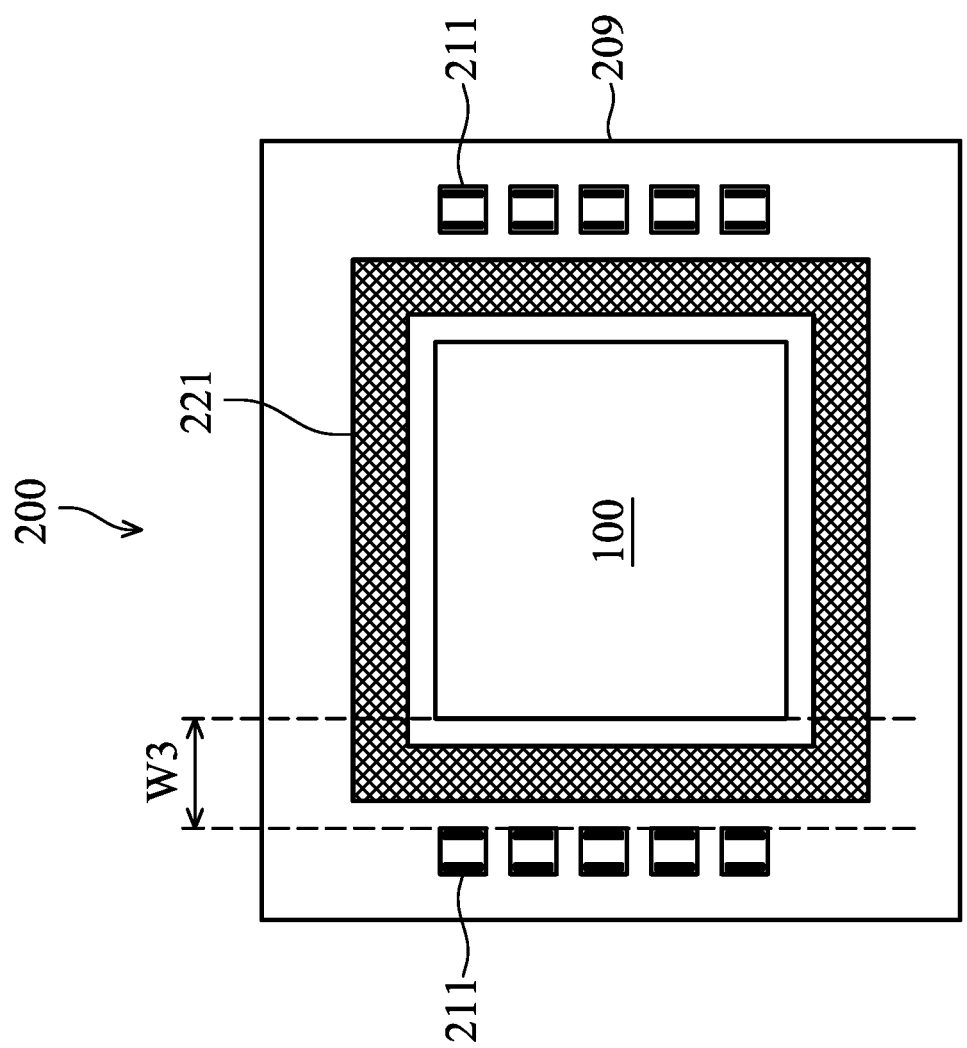

In some embodiments, the material 220 (may also be referred to as a sacrificial material) of the dam structure 221 is deposited (e.g., dispensed) on the upper surface 209U of the substrate 209 in liquid form using a dispensing tool 215. The material 220 is selectively dispensed in a region around the semiconductor device 100 such that the dam structure 221 is formed around the semiconductor device 100, as illustrated in FIGS. 3 and 4. In some embodiments, the material 220 is cured while it is being deposited onto the substrate 209. For example, a curing device 217, which may be a device for generating an ultraviolet (UV) light 219, may be used to perform a UV curing process to cure the material 220 while the material 220 is being deposited on the substrate 209. Depending on the composition of the material 220 used for the dam structure 221, other curing process, such as a thermal curing process, may also be used in place of or in addition to the UV curing process, in which case the curing device 217 may include a heating device. Besides liquid form, the material 220 may also be dispensed in gel form.

In accordance with some embodiments, the dispensing speed for the material 220, and/or parameters of the curing process (e.g., the dosage of the UV light of the UV curing process, and/or the temperature of the thermal curing process) may be adjusted to achieve different shapes (e.g., the profile of the sidewalls of the dam structure 221) for the dam structure (e.g., 221, 221A, 221B). In an embodiment, the UV dosage (e.g., intensity of the UV light) of the UV curing process is adjusted to control the shape of the dam structure 221. For example, a low UV dosage between about 0.1 watt (W) and about 1 W may be used to form the dam structure 221 with a protrusion 221P at the bottom portion, a high UV dosage between about 3 W and about 4 W may be used to form a dam structure 221A with an undercut at the bottom portion (see FIG. 7), and a medium UV dosage between about 1 W and about 3 W may be used to form a dam structure 221B with straight sidewalls (see FIG. 9).

Still referring to FIG. 3, the dam structure 221 is formed to have a height H between about 2 μm and about 1500 μm, and a width W between about 10 μm and about 1000 μm, in some embodiments. If the height H and the width W are smaller than the respective disclosed ranges, the dam structure 221 may not be effective in containing (e.g., limiting) the underfill material 225 in subsequent processing, and the underfill material 225 may spill over the dam structure 221 and contact the passive component 211, which may cause damage to the semiconductor device 200. If the height H and the width W are larger than the disclosed ranges, the material cost and the time needed to form the dam structure 221 may be high and not economical.

FIG. 4 illustrates a top view of the semiconductor device 200 after the dam structure 221 is formed. As illustrated in FIG. 4, the dam structure 221 is formed between the semiconductor device 100 and the passive components 211, and is formed around the semiconductor device 100. In the illustrated embodiment, the dam structure 221 has a rectangular shape (e.g., a hollow rectangular shape), and is spaced part from the semiconductor device 100 and from the passive components 211. Although the dam structure 221 is illustrated to have a rectangular shape in FIG. 4, other suitable shapes, such as triangle shape (e.g., hollow triangle shape), pentagon (e.g., hollow pentagon shape), or other polygon shapes (e.g., hollow polygon shapes), are also contemplated within the scope of the present disclosure.

Figure 5:
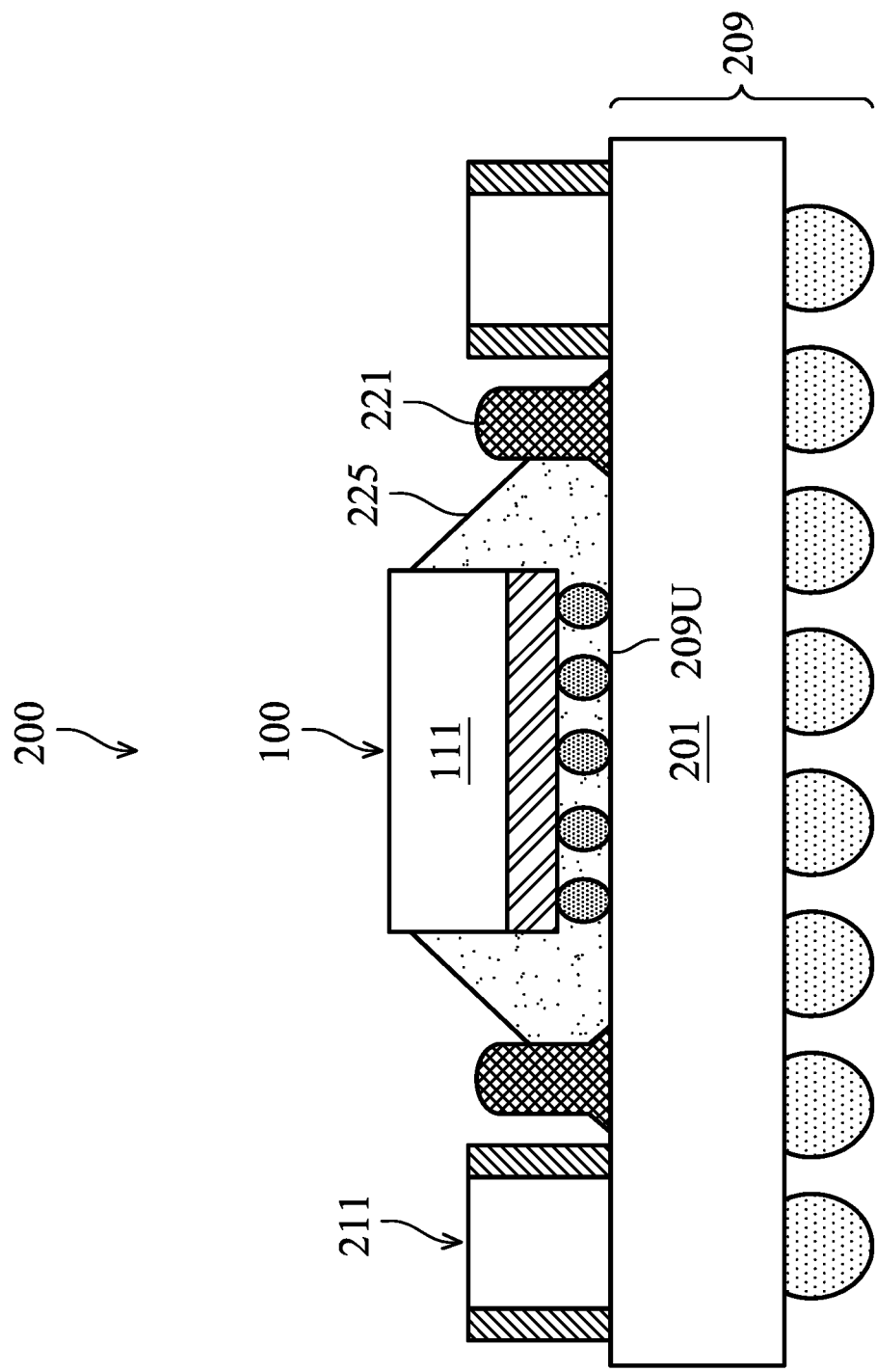

Next, in FIG. 5, the underfill material 225 is deposited (e.g., in liquid form) inside the boundaries (e.g. perimeters) of the dam structure 221, e.g., between the semiconductor device 100 and the substrate 209, and around the semiconductor device 100, and then cured to harden. Portions of the cured underfill material 225 disposed around perimeters (e.g., sidewalls) of the semiconductor device 100 (e.g., portions not directly under the semiconductor device 100) are referred to as a fillet of the underfill material 225. The underfill material 225 may be the same as or similar to the underfill material 133 of FIG. 1A, and may be formed by a same or similar formation method, thus details are not repeated. Due to the confinement of the dam structure 221, the underfill material 225 stays inside the dam structure 221, and areas of the upper surface 209U outside the boundaries of the dam structure 221 are free of the underfill material 225, as illustrated in FIG. 5. In other words, the dam structure 221 prevents or reduces spilling of the underfill material 225 to areas outside the dam structure 221, and as a result, the underfill material 225 does not contact the passive components 211, in some embodiments.

Passive components 211 are bonded to the substrate 209 of the semiconductor device 200 to provide enhanced functionalities. However, as the integration density of semiconductor manufacturing continues to increase, the sizes of the semiconductor device 100 and the substrate 209 continue to shrink, thereby reducing the distance (see, e.g., W3 in FIGS. 4 and 6) between the passive components 211 and the semiconductor device 100. As a result, the underfill material 255, when deposited without using the dam structure 221, may physically contact (e.g., cover) the passive components 211. Due to the mismatch of the coefficients of thermal expansion (CTEs) between the underfill material 225 and the passive components 211, damages such as delamination may occur if the underfill material 225 contacts the passive components 211. The present disclosure, by using the dam structure 221, prevents or reduces spilling of the underfill material 225 to areas of the upper surface 209U outside the dam structure 221, thus preventing or reducing damage to the semiconductor device 200 formed.

The use of the dam structure 221 also allows the distance W3 between the passive components 211 and the semiconductor device 100 to be reduced (compared with a reference method where the dam structure 221 is not used) while still avoiding physical contact between the underfill material 225 and the passive components 211. In other words, the size of the semiconductor device 200 (e.g., the size of the substrate 209) may be reduced without the damage due to physical contact between the underfill material 225 and the passive components 211. In addition, since the underfill material 225 is confined within a smaller area defined by the dam structure 221, a height H2 (see FIG. 6) of the fillet of the underfill material 225 is increased, which provides better protection of the semiconductor device 100, and therefore, improves the reliability and yield of the semiconductor device 200.

Figure 6:
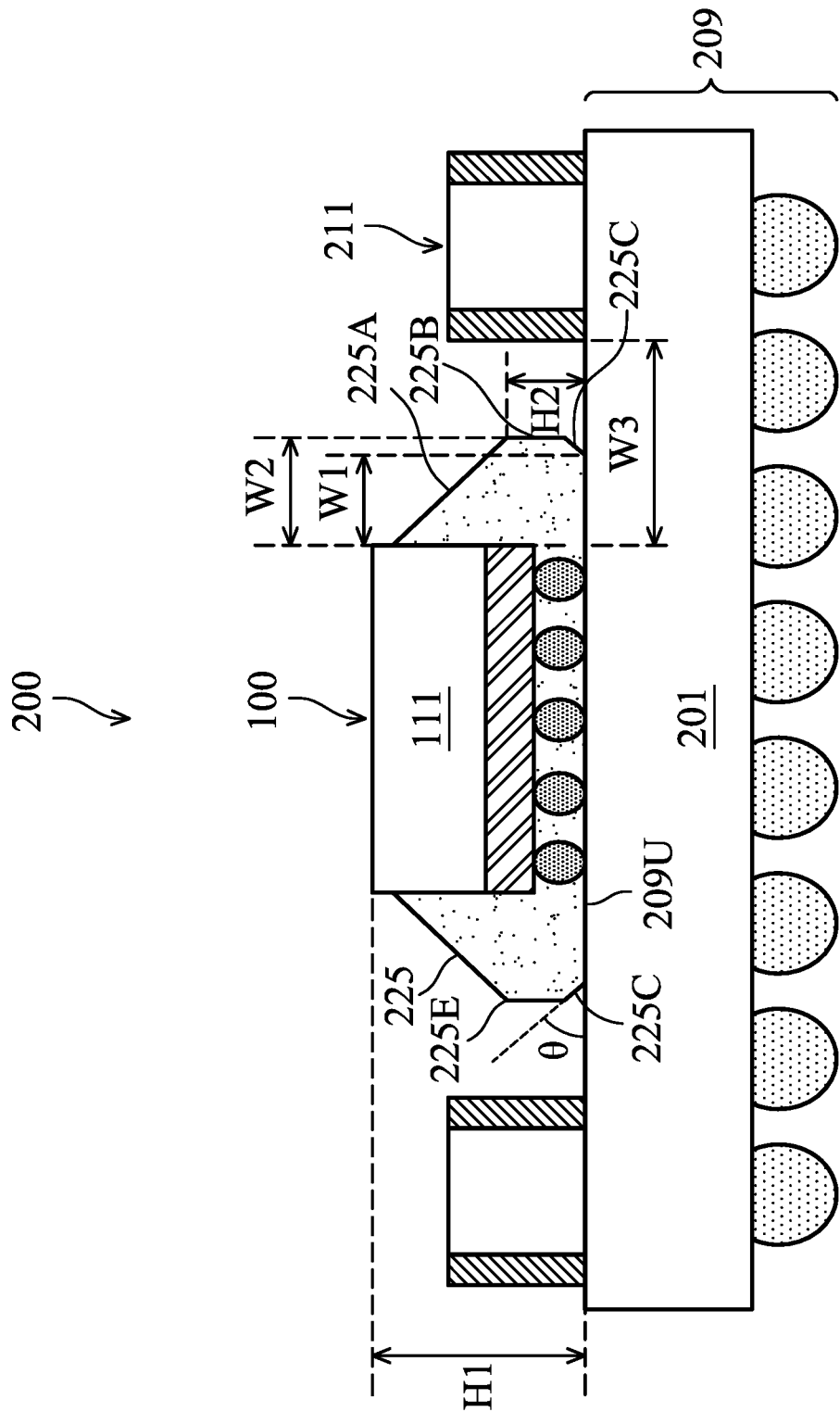

Next, in FIG. 6, after the underfill material 225 is cured, the dam structure 221 is removed. A suitable etching process, such as a wet etch process, may be performed to remove the dam structure 221. In the illustrated embodiment, the dam structure 221 is formed of a polymer (e.g., acrylic polymer), and the etching process is a selective wet etch process using potassium hydroxide (KOH) as the etching chemical. The wet etch process selectively removes the dam structure 221 without substantially attacking other elements of the semiconductor device 200. Although wet etch is used as an example, other suitable removal methods, such as dry etch or plasma etch (e.g., performed using a patterned mask to expose the dam structure 221 while covering other elements of the semiconductor device 200), may also be used and are fully intended to be included within the scope of the present disclosure. In some embodiments, the etching process to remove the dam structure 221 is omitted, and the dam structure 221 remains in the final product of the semiconductor device 200. In embodiments where the dam structure 221 remains in the semiconductor device 200, the shape and the dimensions of the fillet of the (cured) underfill material 225 may be the same as or similar to those illustrated in FIG. 6.

In FIG. 6, the fillet of the (cured) underfill material 225 has an upper portion distal the substrate 209, a lower portion contacting (e.g., in physical contact with) the substrate 209, and a middle portion between the upper portion and the lower portion. The upper portion of the fillet has slanted sidewalls 225A, the middle portion of the fillet has straight sidewalls 225B, and the lower portion of the fillet has slanted sidewalls 225C. Since the bottom portion of the dam structure 221 has a protrusion 221P (see FIG. 3), the corresponding lower portion of the fillet of the underfill material 225 has an undercut. An angle θ of the undercut, measured between the sidewall 225C and the upper surface 209U of the substrate 209, is between about 2 degrees and about 89 degrees, in some embodiments.

In the example of FIG. 6, a width of the upper portion of the fillet of the underfill material 225, measured along the horizontal direction of FIG. 6 between a sidewall of the semiconductor device 100 and a respective sidewall 225A of the underfill material 225, increases as the upper portion extends toward the substrate 209. The middle portion of the fillet has a uniform width, due to the straight sidewalls 225B. The lower portion of the fillet has a width that decreases as the lower portion extends toward the substrate 209. A width W1 of a bottom surface of the fillet contacting the substrate 209 is smaller than a width W2 of the middle portion of the fillet. The width W1 and W2 are smaller than the distance W3 between the semiconductor device 100 and the passive components 211. A height H2 of the fillet of the underfill material 225, measured between the upper surface 209U and an uppermost edge 225E of the middle portion of the fillet, is smaller than a height H1 of the semiconductor device 100, where the uppermost edge 225E is an edge at the interface between the upper portion and the middle portion of the fillet of the underfill material 225.

Figure 7:
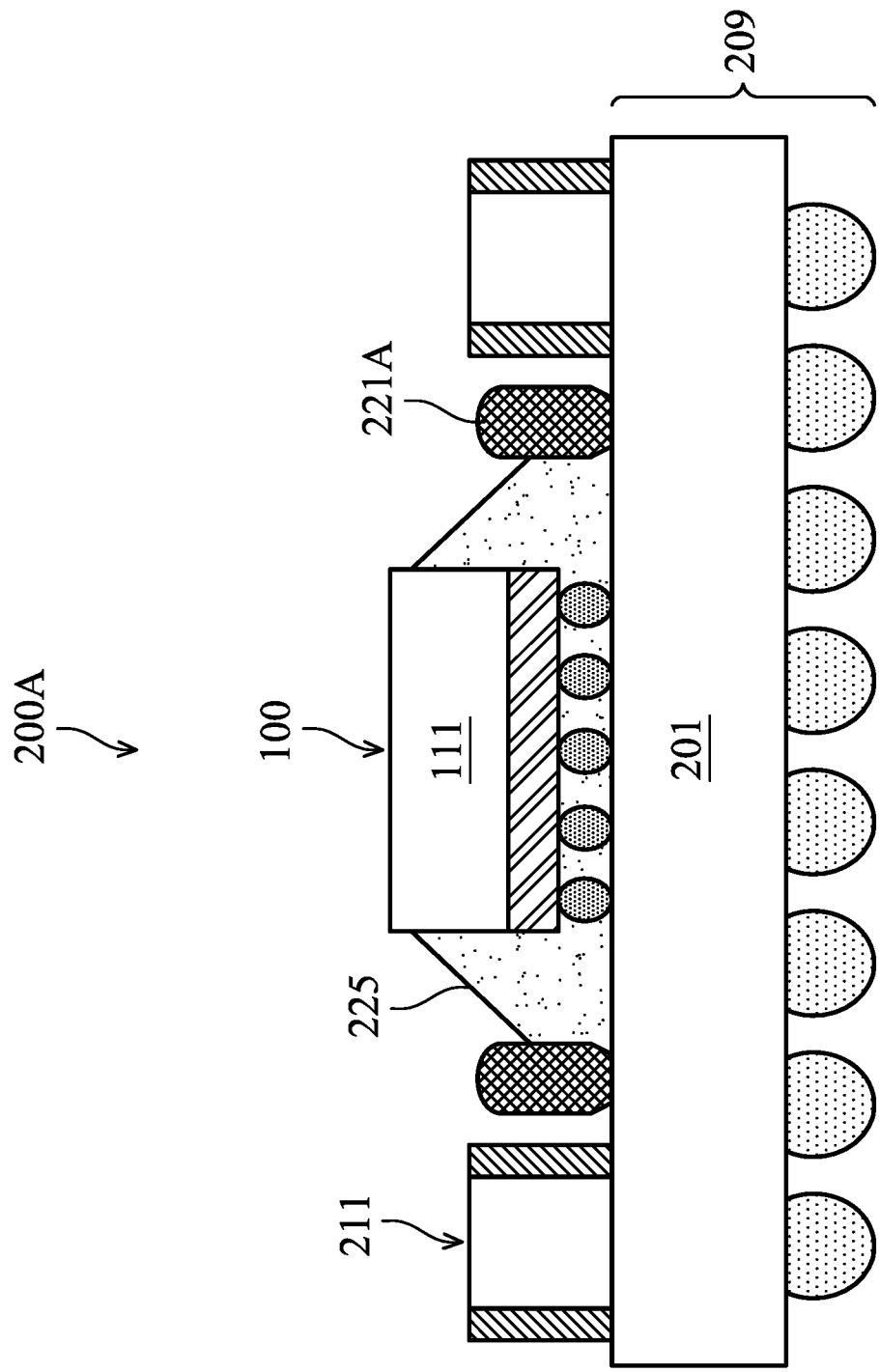
FIGS. 7 and 8 illustrate cross-sectional views of a semiconductor device at various stages of fabrication, in accordance with an embodiment.
Figure 8:
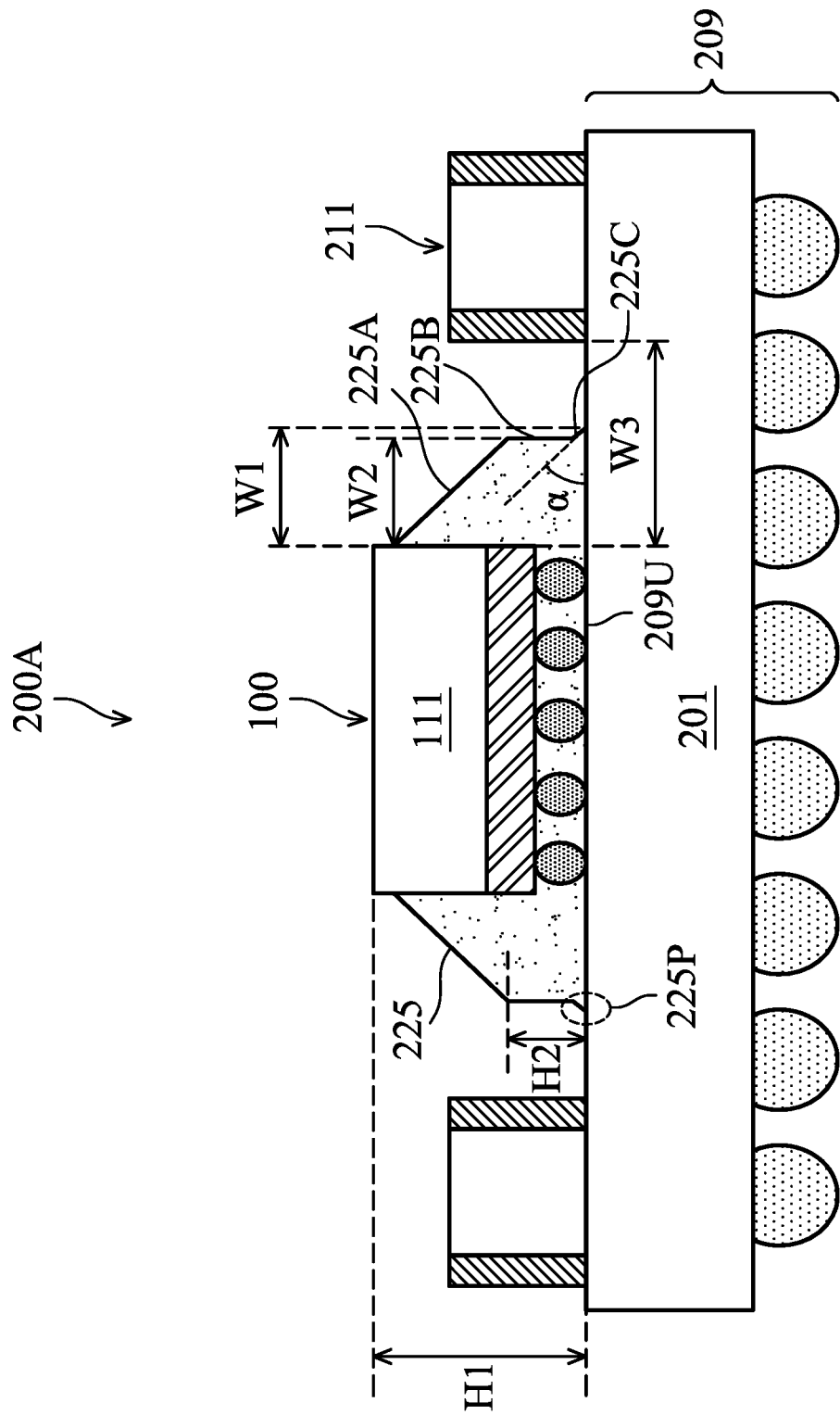

FIGS. 7 and 8 illustrate cross-sectional views of a semiconductor device 200A at various stages of fabrication, in accordance with an embodiment. The semiconductor device 200A is similar to the semiconductor device 200, with like reference numerals referring to like elements formed by a same or similar method using a same or similar material(s). Note that the semiconductor device 200A is formed using a dam structure 221A having a different sidewall profile from the dam structure 221 in FIG. 5. In particular, the bottom portion of the dam structure 221A in FIG. 7 has an undercut. As a result, after the underfill material 225 is deposited and cured, the lower portion of the fillet of the underfill material 225 has a protrusion 225P (see FIG. 8).

Referring to FIG. 8, after the underfill material 225 is cured, the dam structure 221A is removed. The fillet of the (cured) underfill material 225 has an upper portion distal the substrate 209, a lower portion contacting the substrate 209, and a middle portion between the upper portion and the lower portion. The upper portion of the fillet has slanted sidewalls 225A, the middle portion of the fillet has straight sidewalls 225B (e.g., perpendicular to the upper surface 209U), and the lower portion of the fillet has slanted sidewalls 225C. Since the bottom portion of the dam structure 221A has an undercut (see FIG. 7), the lower portion of the fillet has the protrusion 225P. An angle α of the protrusion 225P, measured between the sidewall 225C and the upper surface 209U of the substrate 209, is between about 5 degrees and about 85 degrees, in some embodiments.

In the example of FIG. 8, a width of the upper portion of the fillet of the underfill material 225 increases as the upper portion extends toward the substrate 209. The middle portion of the fillet has a uniform width, due to the straight sidewalls 225B. The lower portion of the fillet has a width that increases as the lower portion extends toward the substrate 209. A width W1 of a bottom surface of the fillet contacting the substrate 209 is larger than a width W2 of the middle portion of the fillet. The width W1 and W2 are smaller than the distance W3 between the semiconductor device 100 and the passive components 211. A height H2 of the fillet of the underfill material 225 is smaller than a height H1 of the semiconductor device 100.

In some embodiments, the etching process to remove the dam structure 221A is omitted, and the dam structure 221A remains in the final product of the semiconductor device 200A. In embodiments where the dam structure 221A remains in the semiconductor device 200A, the shape and the dimensions of the fillet of the (cured) underfill material 225 may be the same as or similar to those illustrated in FIG. 8.

Figure 9:
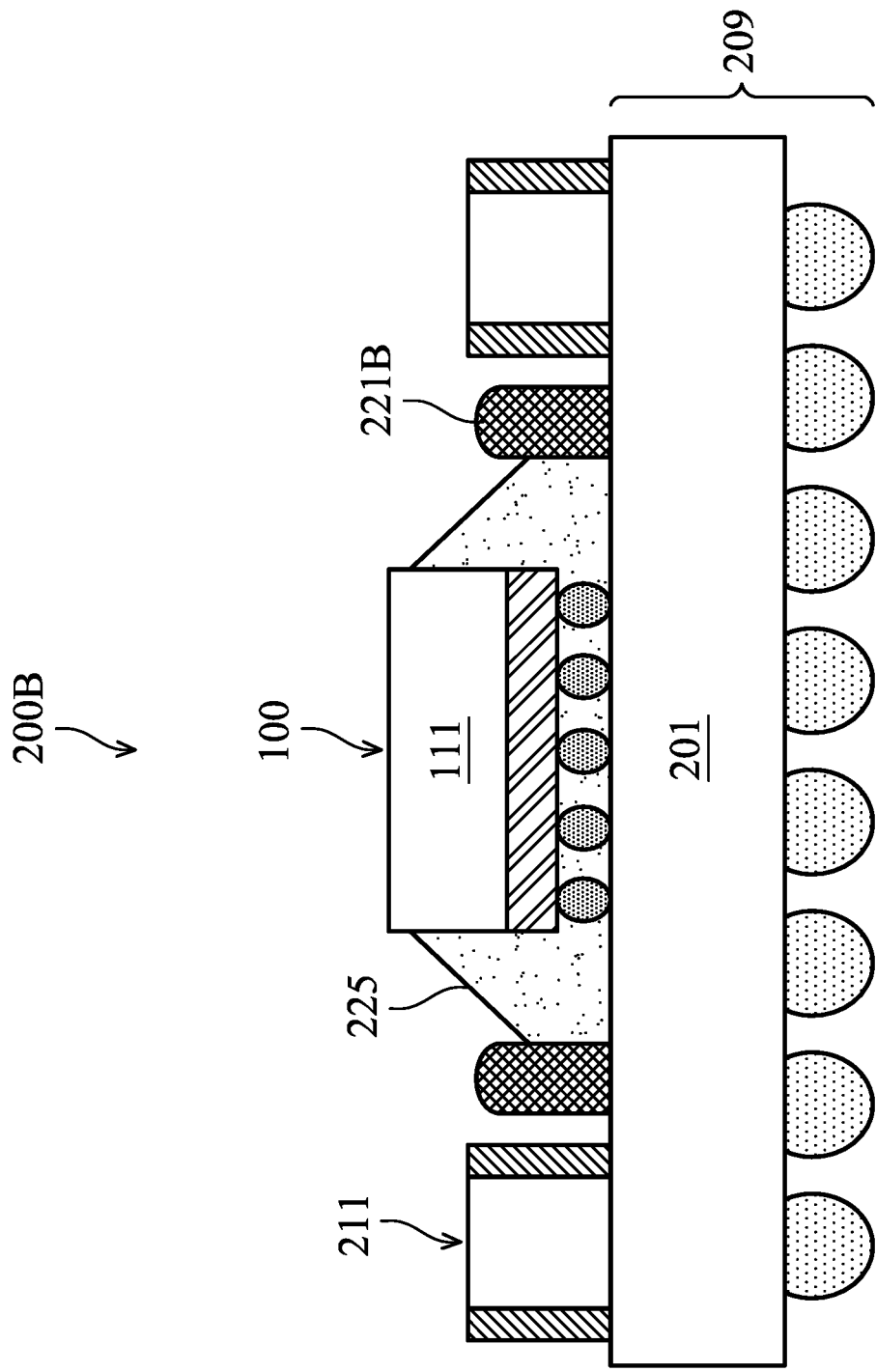
FIGS. 9 and 10 illustrate cross-sectional views of a semiconductor device at various stages of fabrication, in accordance with an embodiment.
Figure 10:
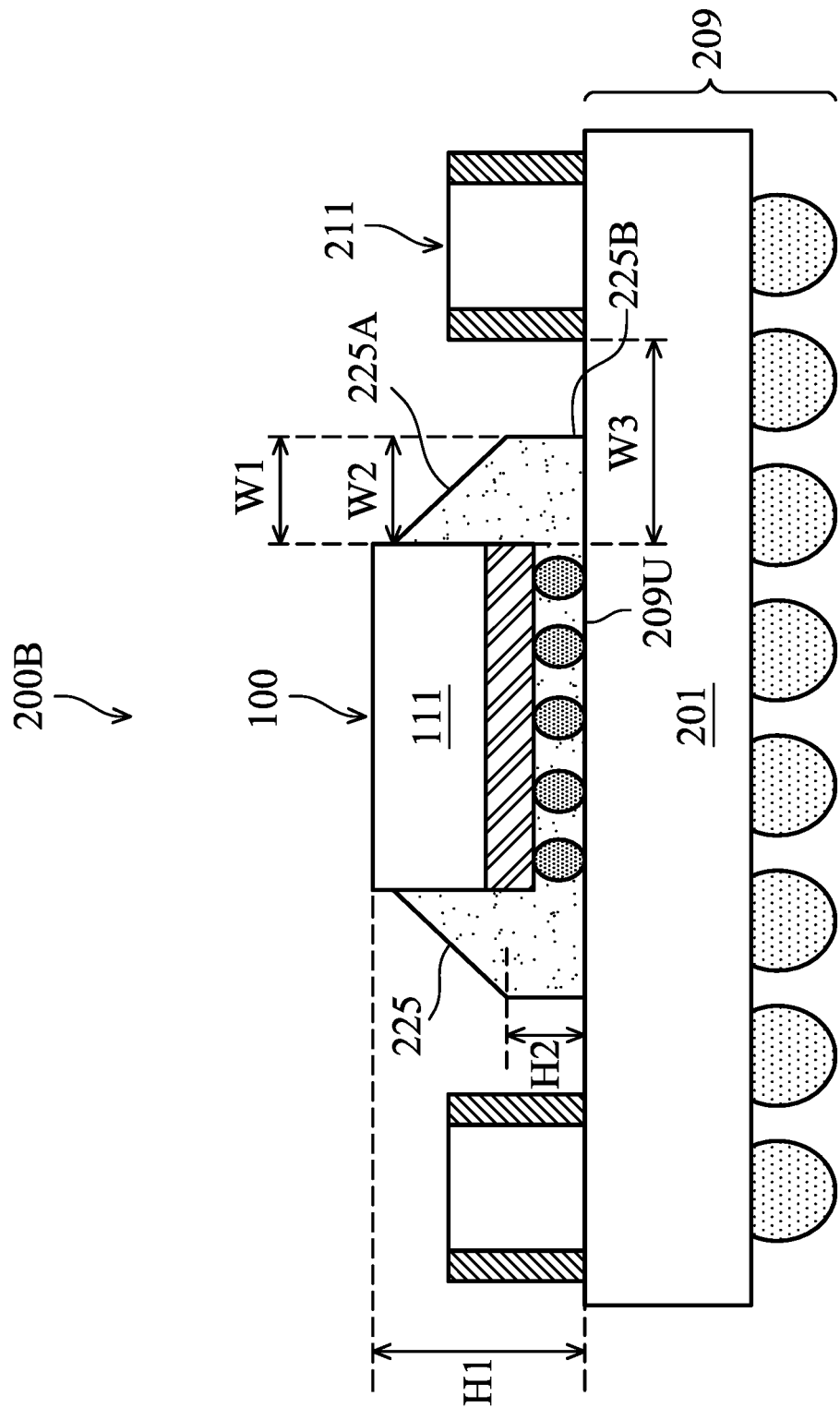

FIGS. 9 and 10 illustrate cross-sectional views of a semiconductor device 200B at various stages of fabrication, in accordance with an embodiment. The semiconductor device 200B is similar to the semiconductor device 200, with like reference numerals referring to like elements formed by a same or similar method using a same or similar material(s). Note that the semiconductor device 200B is formed using a dam structure 221B having a different sidewall profile from the dam structure 221 in FIG. 5. In particular, the dam structure 221B in FIG. 9 has straight sidewalls. As a result, after the underfill material 225 is deposited and cured, the lower portion of the fillet of the underfill material 225 has straight sidewalls.

Referring to FIG. 10, after the underfill material 225 is cured, the dam structure 221B is removed. The fillet of the (cured) underfill material 225 has an upper portion distal the substrate 209 and a lower portion contacting the substrate 209. The upper portion of the fillet has slanted sidewalls 225A, and the lower portion of the fillet has straight sidewalls 225B. Note that due to the straight sidewalls of the dam structure 221B, the fillet of the cured underfill material 225 does not have a middle portion with a different sidewall profile from the lower portion. As a result, in the description of the fillet of the underfill material 225 of FIG. 10, only the upper portion and the lower portion are used to describe the fillet.

In the example of FIG. 10, a width of the upper portion of the fillet of the underfill material 225 increases as the upper portion extends toward the substrate 209. The lower portion of the fillet of the underfill material 225 has a uniform width, due to the straight sidewalls 225B. A width W1 of a bottom surface of the fillet contacting the substrate 209 is equal to a width W2 of the lower portion of the fillet. The width W1 and W2 are smaller than the distance W3 between the semiconductor device 100 and the passive components 211. A height H2 of the fillet of the underfill material 225 is smaller than a height H1 of the semiconductor device 100.

In some embodiments, the etching process to remove the dam structure 221B is omitted, and the dam structure 221B remains in the final product of the semiconductor device 200B. In embodiments where the dam structure 221B remains in the semiconductor device 200B, the shape and the dimensions of the fillet of the (cured) underfill material 225 may be the same as or similar to those illustrated in FIG. 10.

Embodiments may achieve advantages. The disclosed dam structure (e.g., 221, 221A, 221B) prevents or reduces spilling of the underfill material 225 to areas outside of the boundaries of the dam structure. As a result, damages to the semiconductor device 200 due to physical contact between the underfill material 225 and the passive components 211 are avoided or reduced. The dam structure allows reduction of the size of the substrate 209 by allowing the distance between the semiconductor device 100 and the passive components 211 to be reduced, and at the same time, prevents the underfill material 225 from contacting the passive components 211. As another advantage, the height H2 of the fillet of the underfill material 225 is increased as a result of using the dam structure. The increased fillet height provides improved protection for the semiconductor device 100, thus improving reliability of the semiconductor device 200.

Figure 11:
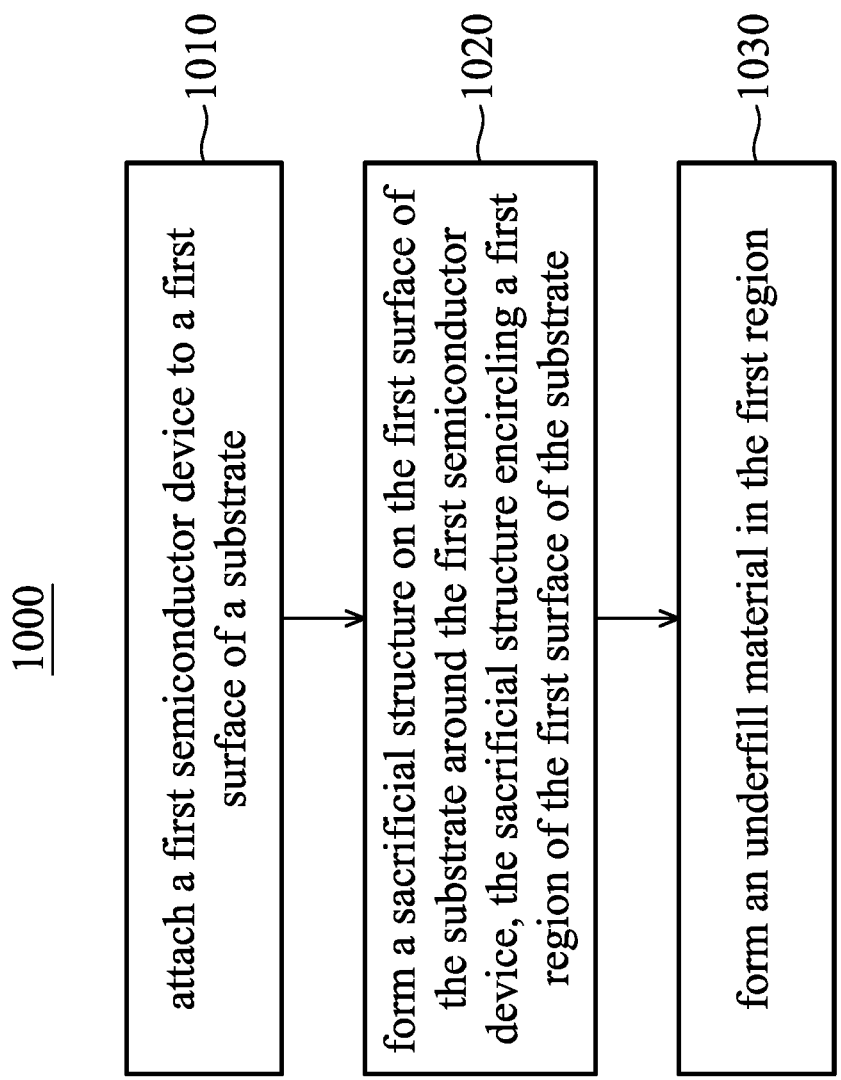
FIG. 11 illustrates a flow chart of a method of forming a semiconductor device, in some embodiments.

FIG. 11 illustrates a flow chart 1000 of a method of forming a semiconductor device, in some embodiments. It should be understood that the embodiment method shown in FIG. 11 is merely an example of many possible embodiment methods. One of ordinary skill in the art would recognize many variations, alternatives, and modifications. For example, various steps as illustrated in FIG. 11 may be added, removed, replaced, rearranged and repeated.

Referring to FIG. 11, at block 1010, a first semiconductor device is attached to a first surface of a substrate. At block 1020, a sacrificial structure is formed on the first surface of the substrate around the first semiconductor device, the sacrificial structure encircling a first region of the first surface of the substrate. At block 1030, an underfill material is formed in the first region.

In accordance with an embodiment, a method of forming a semiconductor device includes attaching a first semiconductor device to a first surface of a substrate; forming a sacrificial structure on the first surface of the substrate around the first semiconductor device, the sacrificial structure encircling a first region of the first surface of the substrate; and forming an underfill material in the first region. In an embodiment, the first surface of the substrate has passive components attached thereto, where the sacrificial structure is formed between the passive components and the first semiconductor device. In an embodiment, forming the sacrificial structure includes dispensing a sacrificial material in liquid form or gel form on the first surface of the substrate around the first semiconductor device; and curing the sacrificial material while the sacrificial material is being dispensed. In an embodiment, curing the sacrificial material includes performing an ultraviolet (UV) curing process or a thermal curing process. In an embodiment, the sacrificial material is cured by the UV curing process, where forming the sacrificial structure includes controlling a shape of the sacrificial structure by adjusting a UV dosage of the UV curing process. In an embodiment, the sacrificial material includes polymer, polyimide, or epoxy. In an embodiment, the sacrificial structure keeps the underfill material within the first region, where regions of the first surface of the substrate other than the first region are free of the underfill material. In an embodiment, the method further includes removing the sacrificial structure after forming the underfill material. In an embodiment, the method further includes curing the underfill material before removing the sacrificial structure. In an embodiment, after the curing, a fillet of the underfill material has an upper portion distal the substrate, a lower portion contacting the substrate, and a middle portion between the upper portion and the lower portion, where a first width of the upper portion increases continuously as the upper portion extends toward the substrate, and the middle portion has a uniform second width. In an embodiment, a third width of the lower portion changes continuously as the lower portion extends toward the substrate. In an embodiment, removing the sacrificial structure includes performing a wet etch process using an etchant that is selective to the sacrificial structure, where the sacrificial structure is formed of an acrylic polymer, and the etchant comprises potassium hydroxide.

In accordance with an embodiment, a method of forming a semiconductor device includes bonding a first semiconductor device to a first area of an upper surface of a substrate, where the upper surface of the substrate has passive components bonded thereto proximate the first area; forming a dam structure on the upper surface of the substrate around the first area, the dam structure disposed between the first semiconductor device and the passive components, the dam structure protruding above the upper surface of the substrate; dispensing an underfill material within perimeters of the dam structure; and curing the dispensed underfill material. In an embodiment, the method further includes removing the dam structure after the curing. In an embodiment, forming the dam structure includes dispensing a polymer material on the upper surface of the substrate around the first semiconductor device; and curing the polymer material as the polymer material is being dispensed. In an embodiment, the polymer material is cured by an ultraviolet (UV) curing process, where the method further comprises adjusting a UV dosage of the UV curing process to control a sidewall profile of the dam structure.

In accordance with an embodiment, a semiconductor device includes a substrate; a first semiconductor device attached to a first side of the substrate; and an underfill material around the first semiconductor device and between the substrate and the first semiconductor device, where a fillet of the underfill material has a first portion distal the substrate and a second portion between the first portion and the substrate, where a first width of the first portion increases continuously as the first portion extends toward the substrate, and a second width of the second portion is uniform. In an embodiment, the fillet of the underfill material further includes a third portion contacting the substrate, the third portion disposed between the second portion and the substrate, where a third width of the third portion changes continuously as the third portion extends toward the substrate. In an embodiment, the third width of the third portion decreases continuously as the third portion extends toward the substrate. In an embodiment, the semiconductor device further includes a dam structure on the first side of the substrate around the first semiconductor device, the underfill material being disposed within boundaries the dam structure, the underfill material extending continuously from the first semiconductor device to the dam structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprises:
a substrate;
a first semiconductor device attached to a first side of the substrate; and
an underfill material around the first semiconductor device and between the substrate and the first semiconductor device, wherein a fillet of the underfill material has a first portion distal from the substrate and a second portion between the first portion and the substrate, wherein a first width of the first portion increases continuously as the first portion extends toward the substrate, and a second width of the second portion is uniform.

2. The semiconductor structure of claim 1, wherein the fillet of the underfill material further comprises a third portion between the second portion and the substrate, wherein a third width of the third portion changes continuously as the third portion extends toward the substrate.

3. The semiconductor structure of claim 2, wherein the third width of the third portion decreases continuously as the third portion extends toward the substrate.

4. The semiconductor structure of claim 2, wherein the third width of the third portion increases continuously as the third portion extends toward the substrate.

5. The semiconductor structure of claim 2, wherein a lower surface of the third portion of the fillet contacts and extends along the first side of the substrate.

6. The semiconductor structure of claim 1, wherein the second portion of the fillet contacts and extends along the first side of the substrate.

7. The semiconductor structure of claim 1, further comprising a second semiconductor device attached to the first side of the substrate, wherein the fillet of the underfill material is disposed between the first semiconductor device and the second semiconductor device.

8. The semiconductor structure of claim 7, wherein the first semiconductor device comprises a semiconductor die bonded to a wafer, and the second semiconductor device is a passive component.

9. The semiconductor structure of claim 1, further comprising a dam structure on the first side of the substrate around the first semiconductor device, wherein the underfill material is disposed within boundaries of the dam structure, and the underfill material extends continuously from the first semiconductor device to the dam structure.

10. The semiconductor structure of claim 9, wherein the dam structure protrudes above the first side of the substrate.

11. The semiconductor structure of claim 10, wherein a sidewall of the fillet of the underfill material facing away from the first semiconductor device contacts and extends along a sidewall of the dam structure facing the first semiconductor device.

12. The semiconductor structure of claim 10, wherein an upper surface of the dam structure distal from the substrate extends further from the substrate than an interface between the first portion and the second portion of the fillet.

13. A semiconductor structure comprises:
a substrate;
a semiconductor device bonded to an upper surface of the substrate; and
an underfill material around the semiconductor device and between the substrate and the semiconductor device, wherein a fillet of the underfill material has a first portion distal from the substrate and has a second portion between the first portion and the substrate, wherein a first sidewall of the first portion facing away from the semiconductor device continuously extends away from a first sidewall of the semiconductor device facing the fillet as the first portion extends toward the substrate, and a second sidewall of the second portion extends parallel to the first sidewall of the semiconductor device.

14. The semiconductor structure of claim 13, wherein the fillet of the underfill material further has a third portion between the second portion and the substrate, wherein a third sidewall of the third portion of the fillet is slanted with respect to the upper surface of the substrate.

15. The semiconductor structure of claim 14, wherein the third sidewall of the third portion continuously extends toward the first sidewall of the semiconductor device as the third portion extends toward the substrate.

16. The semiconductor structure of claim 14, wherein the third sidewall of the third portion continuously extends away from the first sidewall of the semiconductor device as the third portion extends toward the substrate.

17. The semiconductor structure of claim 13, further comprising a dam structure around the semiconductor device and protruding above the upper surface of the substrate, wherein the dam structure comprises a different material from the underfill material, wherein the fillet of the underfill material contacts and extends along a sidewall of the dam structure.

18. A semiconductor structure comprises:
a substrate;
a semiconductor device attached to an upper surface of the substrate; and
an underfill material filling a gap between the substrate and the semiconductor device, wherein a fillet of the underfill material has a first portion distal from the substrate and has a second portion between the first portion and the substrate, wherein a first thickness of the first portion increases as the first portion extends toward the substrate, wherein a second thickness of the second portion remains a same as the second portion extends toward the substrate.

19. The semiconductor structure of claim 18, wherein the underfill material has a third portion between the second portion and the substrate, wherein a third thickness of the third portion changes as the third portion extends toward the substrate.

20. The semiconductor structure of claim 18, further comprising a dam structure, wherein the dam structure encircles the semiconductor device and protrudes above the upper surface of the substrate, wherein the underfill material extends continuously from the semiconductor device to the dam structure.

* * * * *